United States Patent
Kim et al.

(10) Patent No.: US 7,209,526 B2
(45) Date of Patent: Apr. 24, 2007

(54) APPARATUS AND METHOD FOR DETECTING I/Q CHANNEL IMBALANCE IN DIRECT CONVERSION DIGITAL QUADRATURE TRANSMISSION SYSTEM

(75) Inventors: Young-Wan Kim, Daejon (KR); Chang-Seok Lee, Daejon (KR); Yu-Shin Kim, Daejon (KR); Hee-Jin Yoo, Chungcheongnam-do (KR); Eun-Suk Kwak, Daejon (KR)

(73) Assignees: Electronics and Telecommunications Research Institute (KR); Hanbat National University Industry-Academic Cooperation Foundation (KR)

( * ) Notice: Subject to any disclaimer, the term of this patent is extended or adjusted under 35 U.S.C. 154(b) by 454 days.

(21) Appl. No.: 10/889,900

(22) Filed: Jul. 12, 2004

(65) Prior Publication Data

US 2005/0123067 A1  Jun. 9, 2005

(30) Foreign Application Priority Data

Dec. 8, 2003   (KR) .................... 10-2003-0088763

(51) Int. Cl.
*H04L 27/00* (2006.01)
*H04L 27/08* (2006.01)

(52) U.S. Cl. ...................... 375/316; 375/345

(58) Field of Classification Search ............... 375/316, 375/345, 329, 340, 261, 279, 280; 455/232.1–235
See application file for complete search history.

(56) References Cited

U.S. PATENT DOCUMENTS

| | | | |
|---|---|---|---|
| 6,925,132 B2* | 8/2005 | Song et al. | 375/316 |
| 7,010,059 B2* | 3/2006 | Song et al. | 375/316 |
| 7,130,359 B2* | 10/2006 | Rahman | 375/316 |

FOREIGN PATENT DOCUMENTS

| | | |
|---|---|---|
| KR | 1020030064085 | 7/2003 |
| WO | WO 01/02433 | 1/2001 |

* cited by examiner

*Primary Examiner*—Tesfaldet Bocure
(74) *Attorney, Agent, or Firm*—Blakely Sokoloff Taylor & Zafman

(57) ABSTRACT

An apparatus and a method for detecting imbalances between an I-channel signal and a Q-channel signal in order to suppress a spurious signal in a direct conversion digital quadrature transmission system is disclosed. The apparatus includes: a compensation signal generating unit for generating a first and a second compensation signals based on a digital I-channel and a digital Q-channel signals; a baseband signal generating unit for generating an I-channel and a Q-channel baseband signals by converting a radio frequency signal into a low frequency signal; and a detecting unit for detecting a phase imbalance and an amplitude imbalance between the digital I-channel and the digital Q-channel signals by using a correlation between the first and the second compensation signals with the I-channel and the Q-channel baseband signals.

12 Claims, 8 Drawing Sheets

APPARATUS AND METHOD FOR DETECTING I/Q CHANNEL IMBALANCE IN DIRECT CONVERSION DIGITAL QUADRATURE TRANSMISSION SYSTEM

FIELD OF THE INVENTION

The present invention relates to an apparatus and a method for detecting I/Q channel imbalances in a direct conversion quadrature transmission system; and, more particularly, to an apparatus and a method for detecting imbalances between an I-channel signal and a Q-channel signal by using a radio frequency transmitting signal and compensating the radio frequency transmitting signal in response to the detected imbalances for suppressing a spurious signal.

DESCRIPTION OF RELATED ARTS

In a wireless communication system, a heterodyne type transceiver has been widely used because of superior wireless communication characteristics of the heterodyne type transceiver. Recently, a direct conversion type transceiver has been actively studied according to a tendency of miniaturizing a mobile station and lowering a price of the mobile station.

The heterodyne type transceiver has superior wireless communication characteristics in a view of receiving sensitivity and preventing a cross talk. However, the heterodyne type transceiver requires a plurality of additional devices for processing an intermediate frequency signal such as a local oscillator and a filter.

In the mean time, the direct conversion transceiver receives and processes a radio frequency (RF) signal by converting the RF signal into a baseband signal without converting the RF signal to the IF signal. Therefore, it does not require a plurality of devices for process the IF signal. However, in the direct conversion transceiver, a quality of receiving signal is decreased caused by an imbalance between an I-channel signal and a Q-channel signal, a reverse leakage of local oscillated signal and low frequency noise. Furthermore, a quality of transmitting signal is decreased cause by an un-stable of oscillated signal and an imbalance between the I-channel signal and the Q-channel signal.

For overcoming the above mentioned problems of the direct conversion transceiver while maintaining advantages of the direction conversion transceiver, a direct conversion low intermediate frequency (IF) type transceiver has been introduced. The direction conversion low IF type transceiver has a heterodyne type transceiving structure using a low frequency of the intermediate frequency (IF).

The direction conversion low IF type transceiver directly converts the IF signal into a digital signal and processes the IF signal in a digital region. Therefore, additional device for processing the IF signals are not required in the direct conversion low IF type transceiver.

However, a quality of signal is degraded by an image signal in a receiver and a channel interference is caused by a spurious signal in a transmitter in the direct conversion low IF type transceiver.

Therefore, a frequency mixer is widely used in the direct conversion low IF type transceiver for eliminating the image signal and the spurious signal. Among various frequency mixers, a weaver type frequency mixer has been widely used because of wide bandwidth characteristics of the waver type frequency mixer.

In order to perfectly eliminate the image signal and the spurious signal, the frequency mixer requires identical amplification degree of the I-channel signal and the Q-channel signal, and exact 90 degree of a phase difference between the I-channel signal and the Q-channel signal. However, a performance of the frequency mixer is degraded by imbalances between the I-channel signal and the Q-channel signal. That is, the spurious signal is not perfectly eliminated by the weaver type frequency mixer since imbalances between the I-channel signal and the Q-channel signal.

In a transmitter, the imbalances of the I-channel signal and the Q-channel signal are detected and compensated for suppressing the spurious signal generated at the frequency mixer. That is, before transmitting a RF signal, a digital signal processor (DSP) generates an I-channel baseband signal and a Q-channel baseband signal for detecting the imbalances of the I-channel signal and the Q-channel signal. After detecting the imbalances, the transmitter generates and transmits a RF signal by compensating the I-channel signal and the Q-channel signal generated from the DSP based on the detected imbalances.

FIG. 1 is a diagram illustrating a conventional direct conversion low IF transmitter using a weaver type frequency mixer in accordance with a prior art.

The conventional direct conversion low IF transmitter 100 generates an I-channel signal and a Q-channel signal for detecting a phase imbalance and an amplitude imbalance between an I-channel signal and a Q-channel signal before transmitting a radio frequency (RF_signal and compensating the I-channel signal and the Q-channel signal based on the detected phase imbalance and the detected amplitude imbalance for suppressing the spurious signal generated from the weaver type frequency mixer.

As shown, the conventional direct conversion low IF transmitter 100 includes a local oscillator 101, a mixer 102 and a low pass filter 103, an analog-to-digital converter 104, a bandpass filter (BPF) 105, an I/Q channel baseband signal generator 106, an imbalance detector 107, a digital signal processor (DSP) 108, an imbalance compensator 109 and a weaver type frequency mixer 110.

Before transmitting a radio frequency (RF) signal (RFout), the DSP 108 generates an I-channel signal and a Q-channel signal for detecting imbalances between the I-channel signal and the Q-channel signal and the weaver type frequency mixer 110 generates the RF transmitting signal (RFout).

The local oscillator 101, the mixer 102 and the low pass filter 103 converts the RF signal (RFout) into an intermediate frequency (IF) signal.

The analog-digital converter (ADC) 104 converts the IF signal into a digital IF signal, the band-pass filter 105 converts the digital IF signal into a baseband signal and the I/Q channel signal generator 106 generates an I-channel baseband signal and a Q-channel baseband signal.

The I/Q channel baseband signal generator 106 includes a first multiplexer 106A for multiplexing a sine element with the baseband signal by using a local oscillator 106D in order to generator a first baseband signal, a second multiplexer 106B for multiplexing a cosine element to the baseband signal by using the local oscillator 106D and a phase shifter 106C in order to generate a second baseband signal. The I/Q channel signal generator 106 further includes a pair of low pass filters 106E, 106F and a pair of power amplifiers 106G, 106H for filtering and amplifying the first and the second baseband signals in order to generate the I-channel baseband signal and the Q-channel baseband signal.

The imbalance detector 107 detects a phase imbalance and an amplitude imbalance between the I-channel baseband signal and the Q-channel baseband signal by comparing an I-channel signal and a Q-channel signal generated from the DSP 108.

The imbalance compensator 109 sets a compensation values based on the detected phase imbalances and the detected amplitude imbalance and compensates the I-channel signal and Q-channel signal generated from the DSP 108 in response to the compensation values.

The frequency mixer 110 generates a RF signal RFout by using the compensated I-channel signal and the compensated Q-channel signal.

In the conventional direct conversion low IF transmitter 100, the I-channel signal and the Q-channel signal are additionally generated before transmitting the RF signal for detecting the phase and the amplitude imbalances.

Furthermore, additional time is required for detecting the phase imbalance and the amplitude imbalance between the I-channel signal and the Q-channel signal before transmitting the RF signal.

Furthermore, the conventional direct conversion low IF transmitter may generate spurious signal because the conventional direction conversion low IF transmitter predetermines imbalances before transmitting a RF signal and continuously uses the detected imbalance for transmitting the RF signal. A phase imbalance and an amplitude imbalance between an I-channel signal and a Q-channel signal may be changed according to environment condition such as temperature. When the environment condition is changed during transmitting the RF signal, the conventional direction conversion low IF transmitter still uses the phase and the amplitude imbalance detected before transmitting the RF signal.

Moreover, the conventional direct conversion low IF transmitter 100 requires additional local oscillator for converting the RF signal RFout into the low IF signal.

SUMMARY OF THE INVENTION

It is, therefore, one object of the present invention to provide an apparatus and a method for detecting imbalances between an I-channel signal and a Q-channel signal by directly using a transmitting signal in a direct conversion low IF transmitter.

It is another object of the present invention to provide an apparatus and a method for suppressing a spurious signal in order to improve a quality of a transmitting signal by directly using a transmitting signal.

It is still another object of the present invention provide an apparatus and a method for detecting and compensating imbalances between an I-channel signal and a Q-channel signal by directly using a transmitting signal in order to suppress spurious signal in real time.

In accordance with one aspect of the present invention, there is provided an apparatus for detecting imbalances between an I-channel signal and a Q-channel signal in order to suppress a spurious signal in a direct conversion digital quadrature transmission system having a digital signal processor and a weaver type frequency mixer, the apparatus including: a compensation signal generating unit for generating a first compensation signal and a second compensation signal based on a digital I-channel signal and a digital Q-channel signal generated from the digital signal processor; a baseband signal generating unit for generating an I-channel baseband signal and a Q-channel baseband signal by converting a radio frequency transmitting signal outputted from the direct conversion digital quadrature transmission system into a low frequency signal by squaring the radio frequency transmitting signal and multiplexing the low frequency signal with two sine waves having difference phases; and a detecting unit for detecting a phase imbalance and an amplitude imbalance between the digital I-channel signal and the digital Q-channel signal by using a correlation between the first compensation signal and the second compensation signal with the I-channel baseband signal and the Q-channel baseband signal.

In accordance with another aspect of the present invention, there is also provided a direct conversion digital quadrature transmission system, including: a digital I/Q signal generating unit for generating a digital I-channel signal and a digital Q-channel signal; a radio frequency signal generating unit for generating a radio frequency signal by converting the digital I-channel signal and the digital Q-channel signal into the radio frequency signal; a compensation signal generating unit for generating a first compensation signal and a second compensation signal by mixing the digital I-channel signal and the digital Q-channel signal; a baseband signal generating unit for generating an I-channel baseband signal and a Q-channel baseband signal by converting the radio frequency signal into a low intermediate frequency (IF) signal by squaring the radio frequency signal and multiplexing the low IF signal with two sine waves having different phases; and a detecting unit for detecting a phase imbalance and an amplitude imbalance by a correlation between the first compensation signal and the second compensation signal, and the I-channel baseband signal and the Q-channel baseband signal, wherein the digital signal generating unit generates the digital I-channel signal and the digital Q-channel signal in response to detected phase imbalance and the amplitude imbalance.

In accordance with still another aspect of the present invention, there is also provided a method for detecting imbalances between an I-channel signal and a Q-channel signal in order to suppress a spurious signal in a direct conversion digital quadrature transmission system having a digital signal processor and a weaver type frequency mixer, the method including the steps of: a) generating a digital I-channel signal and a digital Q-channel signal by converting a transmitting data into the digital I-channel signal and the digital Q-channel signal; b) generating a radio frequency signal by converting the digital I-channel signal and the digital Q-channel signal into the radio frequency signal; c) generating a first compensation signal and a second compensation signal by using the digital I-channel signal and the digital Q-channel signal; d) generating an I-channel baseband signal and a Q-channel baseband signal by converting the radio frequency signal into a low intermediate frequency signal by squaring the radio frequency signal and multiplexing the low frequency signal with two sine waves having difference phases; e) detecting a phase imbalance and an amplitude imbalance by using a correlation between the first compensation signal and the second compensation signal with the I-channel baseband signal and the Q-channel baseband signal; and f) compensating the digital I-channel signal and the digital Q-channel signal in response to the detected phase imbalance and the detected amplitude imbalance.

BRIEF DESCRIPTION OF THE DRAWINGS

The above and other objects and features of the present invention will become better understood with regard to the following description of the preferred embodiments given in conjunction with the accompanying drawings, in which.

DETAILED DESCRIPTION OF THE INVENTION

Hereinafter, an apparatus and a method for detecting imbalances between an I-channel signal and a Q-channel signal by directly using a transmitting signal and compensating the transmitting signal in response to the detected imbalances for suppressing a spurious signal in a direct conversion digital quadrature transmission system will be described in detail with reference to the accompanying drawings.

Figure 1:
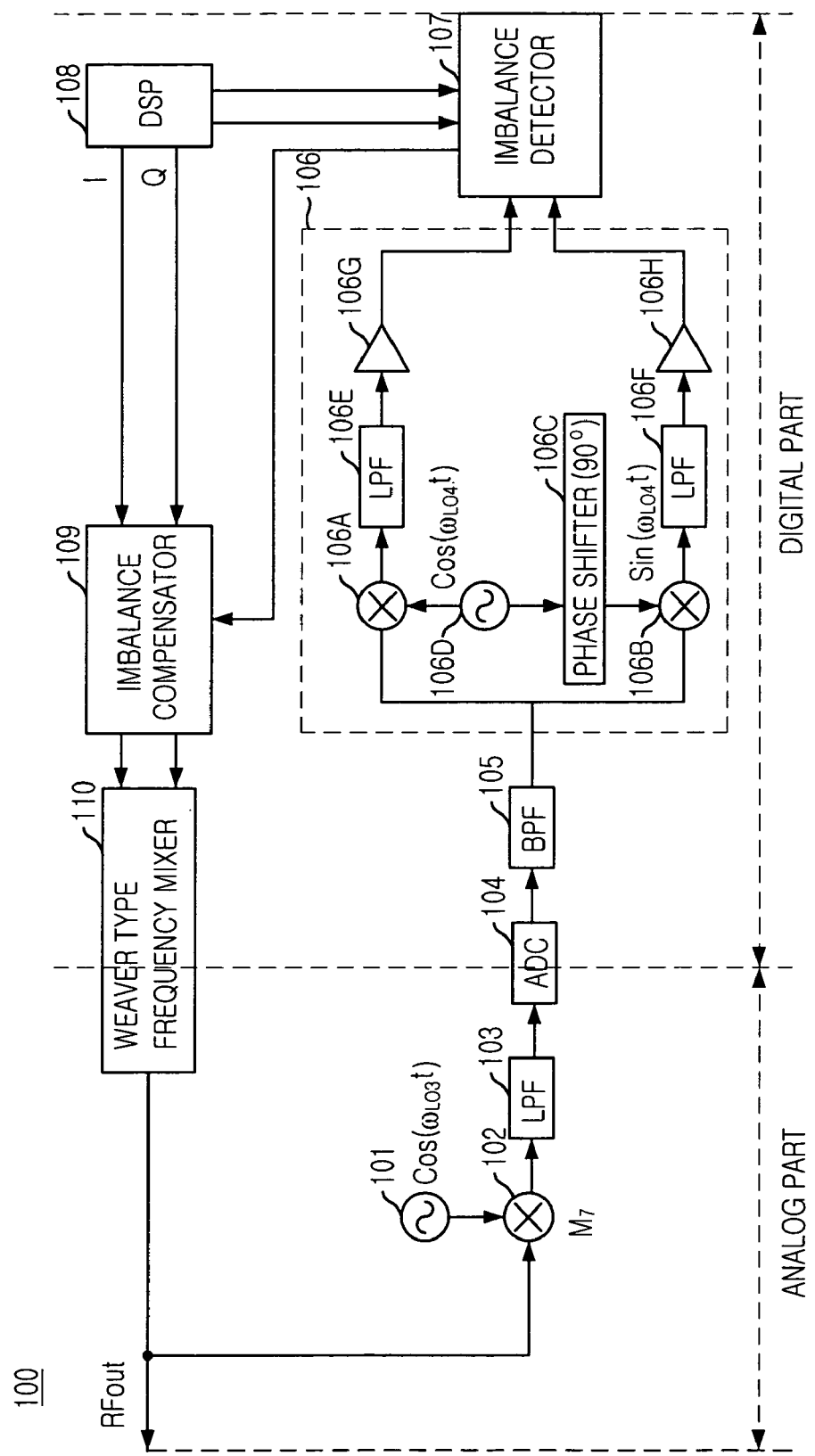
FIG. 1 is a diagram illustrating a conventional direct conversion low IF transmitter using a weaver type frequency mixer in accordance with a prior art.
Figure 2:
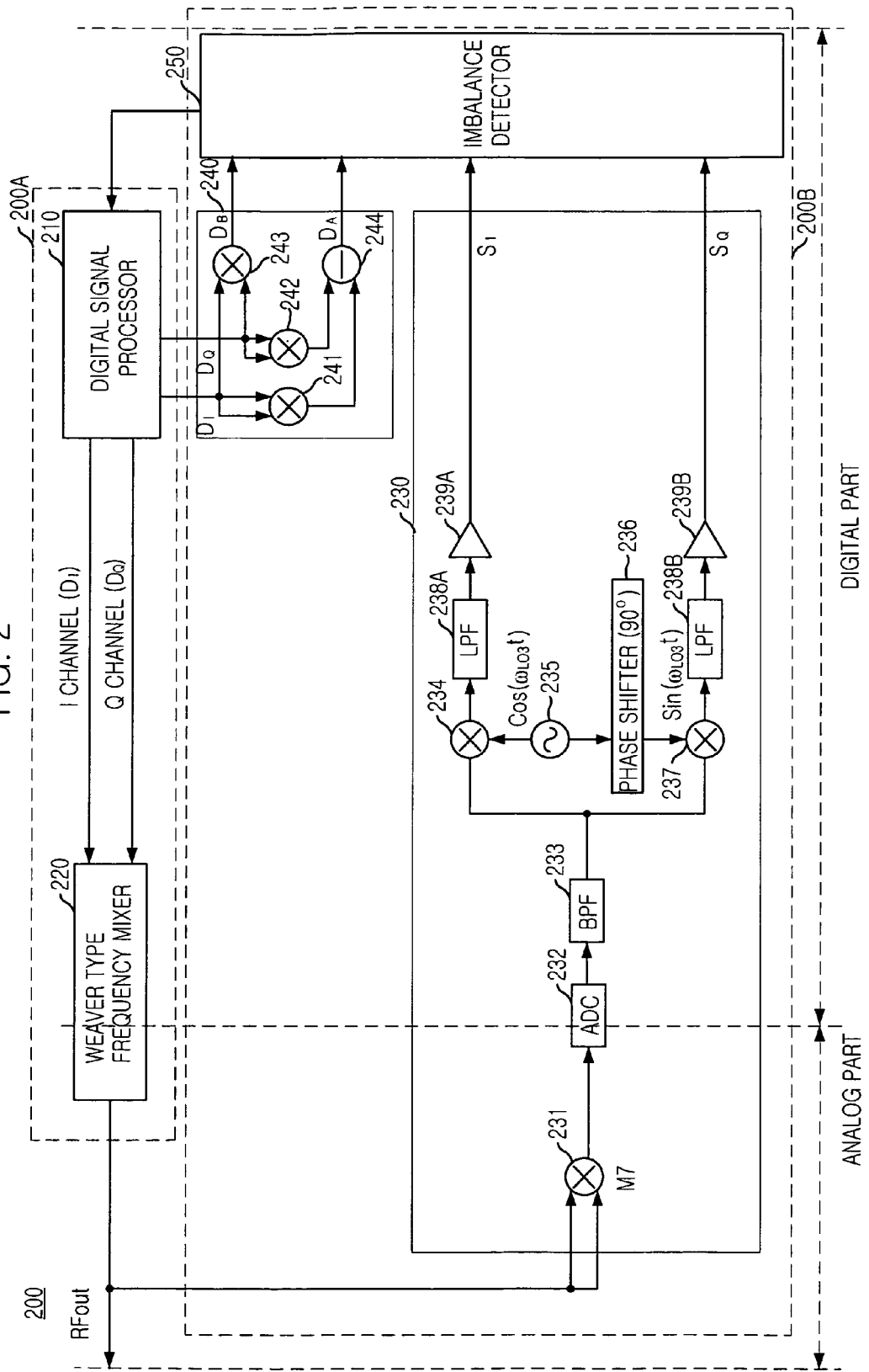
FIG. 2 is a diagram illustrating a direct conversion low IF transmitting system in accordance with a preferred embodiment of the present invention.

FIG. 2 is a diagram illustrating a direct conversion low IF transmitting system in accordance with a preferred embodiment of the present invention.

The direct conversion low IF transmitting system 200 detects and compensates imbalances between an I-channel signal and a Q-channel signal by using an imbalance detecting unit 200B of the present invention and suppresses a spurious signal included in a radio frequency (RF) transmitting signal $RF_{out}$.

As shown, the direct conversion low IF transmitting system 200 includes a transmitter 200A provided with a digital signal processor (DSP) 210 and a weaver type frequency mixer 220, and an imbalance detecting unit 200B provided with an I/Q channel signal generator 230, a compensation signal generator 240 and an imbalance detector 250.

The DSP 210 generates a digital I channel signal $D_I$ and a digital Q channel signal $D_Q$ as a transmitting signal.

The weaver type frequency mixer 220 generates a radio frequency (RF) transmitting signal $RF_{out}$ by receiving and mixing the digital I channel signal $D_I$ and the digital Q channel signal $D_Q$.

The compensation signal generator 240 generates a compensation signals $D_A$ and $D_B$ based on the digital I channel signal $D_I$ and the digital Q channel signal $D_Q$ from the DSP 210.

The I/Q channel signal generator 230 generates an I-channel baseband signal $S_I$ and a Q-channel baseband signal $S_Q$ by receiving the RF transmitting signal $RF_{out}$ from the weaver type frequency mixer 220.

Hereinafter, the compensation signal generator 240 is explained in detail.

The compensation signal generator 240 includes a first multiplexer 241, a second multiplexer 242, a third multiplexer 243 and a subtracter 244.

The first multiplexer 241 squares the digital I channel signal $D_I$ from the DSP 210 and outputs the squared I channel signal to the subtracter 244.

The second multiplexer 242 squares the digital Q channel signal $D_Q$ from the DSP 210 and outputs the squared Q channel signal to the subtracter 244.

The subtracter 244 generates a first compensation signal $D_A$ by subtracting the squared Q channel signal $D_Q^2$ from the squared I channel signal $D_I^2$.

The first compensation signal $D_A$ can be expressed:

$$D_A = D_I^2 - D_Q^2 \qquad \text{Eq. 1}$$

The third multiplexer 243 generates a second compensation signal $D_B$ by multiplexing the digital I channel signal $D_I$ and the digital Q channel signal $D_Q$.

The second compensation signal $D_B$ can be expressed as:

$$D_B = D_I D_Q \qquad \text{Eq. 2}$$

Hereinafter, the I/Q channel signal generator 230 is explained in detail.

The I/Q channel signal generator 230 generates the I channel baseband signal $S_I$ and the Q channel baseband signal $S_Q$ by receiving the RF transmitting signal $RF_{out}$ from the low IF frequency mixer 220.

The I/Q channel signal generator 230 includes a first frequency mixer 231, an analog-to-digital converter (ADC) 232, a baseband pass filter (BPF) 233, a second mixer 234, an local oscillator 235, a phase shifter 236, a third frequency mixer 237, a pair of low pass filters 238A, 238B, and a pair of amplifiers 239A, 239B.

The first mixer 231 receives the RF transmitting signal $RF_{out}$ and converts the RF transmitting signal $RF_{out}$ into a low frequency signal without using additional local oscillator. That is, the first mixer 231 generates the low intermediate frequency signal by squaring the RF transmitting signal $RF_{out}$.

The ADC 232 receives the low intermediate frequency signal from the first mixer 231 and converts the low intermediate frequency signal into a digital signal.

The BPF 233 generates a filtered signal by filtering the digital signal from the ADC 232.

The second frequency mixer 234 receives the filtered signal and generates a first mixed signal by mixing the filtered signal with an oscillated signal from the local oscillator 235.

The LPF 238A filters the first mixed signal and generates a first filtered signal and the amplifier 239A amplifies a gain of the first filtered signal in order to generate the I channel baseband signal $S_I$.

The third frequency mixer 237 receives the filtered signal and generates a second mixed signal by mixing the filtered signal with a 90 degrees shifted oscillated signal from the phase shifter 236.

The LPF 238B filters the second mixed signal and generates a second filtered signal and the amplifier 239B amplifies a gain of the second filtered signal in order to generate the Q channel baseband signal $S_Q$.

The I-channel baseband signal and the Q-channel signal can be expressed as:

$$S_I = -\frac{1}{2}D_B(1+\Delta A)\sin(\Delta\theta) - \frac{1}{8}D_A\Delta A(1+\Delta A) \quad \text{Eq. 3}$$

$$S_Q = \frac{1}{4}D_A(1+\Delta A)\sin(\Delta\theta) - \frac{1}{4}D_B\Delta A(1+\Delta A) \quad \text{Eq. 4}$$

Wherein, $D_A$ is the first compensation signal, $D_B$ is the second compensation signal, $D_I$ is the digital I channel signal, $D_Q$ is the digital Q channel signal, $\Delta A$ is an amplitude imbalance and $\Delta\theta$ is a phase imbalance.

In the Eqs. 3 and 4, gains of elements are considered as 1 for simple calculation.

The imbalance detector 250 detects the amplitude imbalance and the phase imbalance by using the first compensation signal $D_A$, the second compensation signal $D_B$, the I-channel baseband signal $S_I$ and the Q-channel signal $S_Q$ for suppressing the spurious signal included in the radio frequency transmitting signal The detected amplitude imbalance and the detected phase imbalance are passed to the DSP 210. The DSP 210 generates the digital I-channel signal $D_I$ and a digital Q-channel signal $D_Q$ as a transmitting signal by eliminating the digital I-channel signal $D_I$ and the digital Q-channel signal $D_Q$ in response to the detected amplitude imbalance and the detected phase imbalance.

The imbalance detector 250 detects the amplitude imbalance $\Delta A$ and the phase imbalance $\Delta\theta$ in the RF transmitting signal by comparing the first compensation signal $D_A$ and the second compensation signal $D_B$ with the I-channel baseband signal $S_I$ and the Q-channel baseband signal $S_Q$.

In Eqs. 3 and 4, amounts of the amplitude imbalance and the phase imbalance are not considerable since the amplitude imbalance $\Delta A$ and the phase imbalance $\Delta\theta$ are calculated with considering gains of elements as 1. Only signs of the amplitude imbalance $\Delta A$ and the phase imbalance $\Delta\theta$ are considered in Eqs. 3 and 4.

According to Eqs. 3 and 4 of the present invention, the signs of the amplitude imbalance $\Delta A$ and the phase imbalance $\Delta\theta$ are independently obtained and the present invention suppresses the spurious signal included in the RF transmitting signal in real time by using the obtained signs of the amplitude imbalance value $\Delta A$ and the phase imbalance value $\Delta\theta$.

Figure 3:
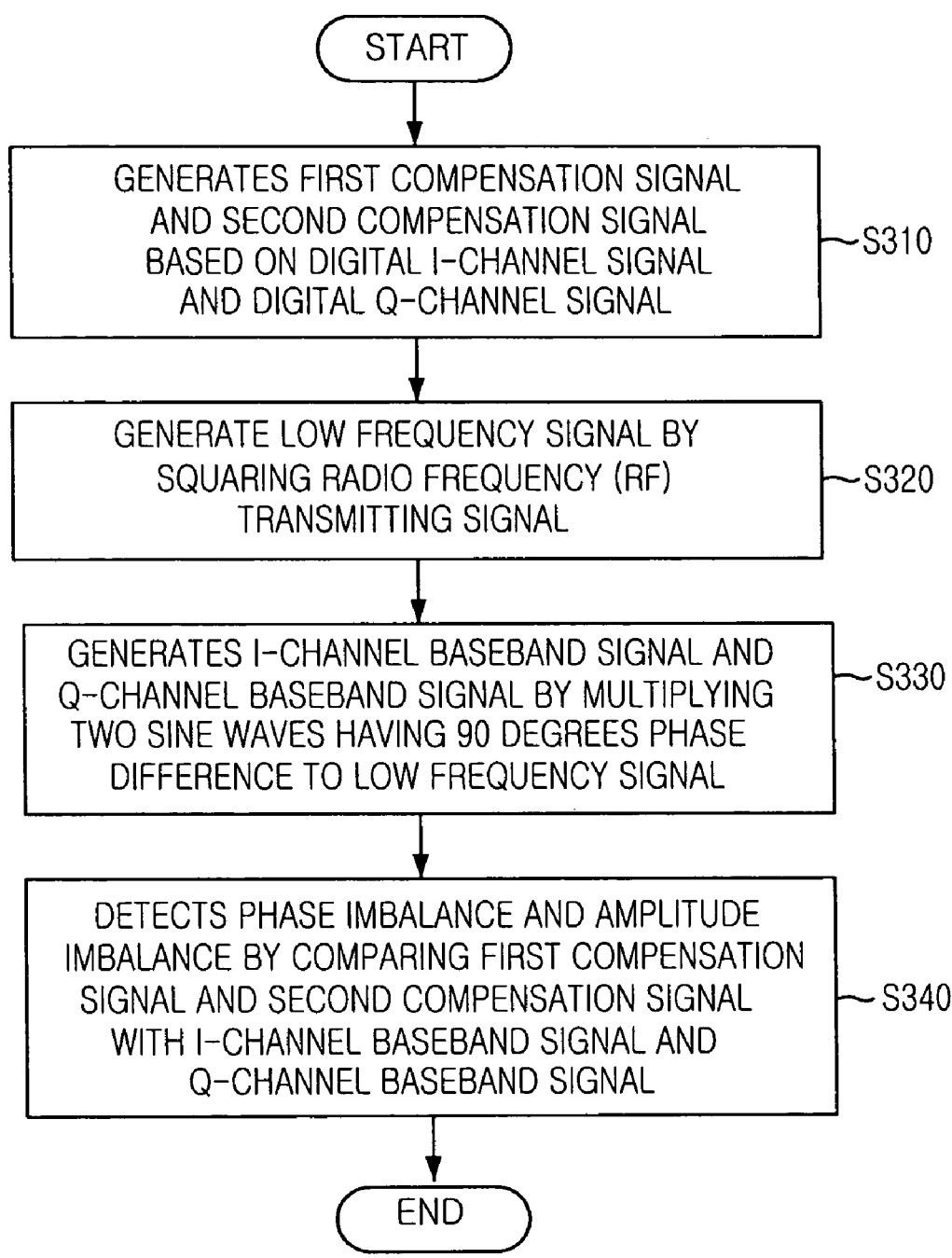
FIG. 3 is a flowchart showing a method for detecting a phase imbalance and an amplitude imbalance between an I-channel signal and a Q-channel signal in accordance with a preferred embodiment of the present invention.

FIG. 3 is a flowchart showing a method for detecting a phase imbalance and an amplitude imbalance between an I-channel signal and a Q-channel signal in accordance with a preferred embodiment of the present invention.

At step S310, a compensation signal generator generates a first compensation signals $D_A$ and a second compensation signal $D_B$ based on the digital I channel signal $D_I$ and the digital Q channel signal $D_Q$ from a digital signal processor. The first compensation signals $D_A$ and the second compensation signal $D_B$ are computed by using equation Eqs. 1 and 2.

At step S320, an I/Q channel signal generator squares a radio frequency (RF) transmitting signal from a weaver type frequency mixer to generate a low frequency signal.

At step S330, the I/Q channel signal generator generates a I-channel baseband signal $S_I$ and a Q-channel baseband signal $S_Q$ by multiplying two sine waves having 90 degrees phase difference to the low frequency signal.

At step S340, an imbalance detector detects a phase imbalance and an amplitude imbalance between the digital I-channel signal $D_I$ and the digital Q-channel signal $D_Q$ by comparing the first compensation signal $D_A$ and the second compensation signal $D_B$ with the I-channel baseband signal $S_I$ and the Q-channel baseband signal $S_Q$. That is, the phase imbalance and the amplitude imbalance are obtained by using Eqs. 3 and 4.

Figure 4:
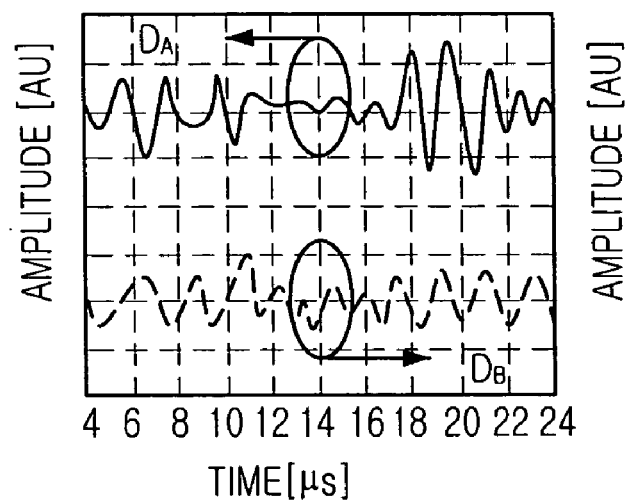
FIG. 4 is a graph showing waveforms of a first compensation signal DA and a second compensation signal DB in accordance with a preferred embodiment of the present invention.

FIG. 4 is a graph showing waveforms of a first compensation signal $D_A$ and a second compensation signal $D_B$ in accordance with a preferred embodiment of the present invention.

The waveforms of the first compensation signal $D_A$ and the second compensation signal $D_B$ are obtained from a simulation case using the method of the present invention shown in FIG. 3 with conditions that signals of 1 Mbps is used for a digital I-channel signal $D_I$ and a digital Q-channel signal $D_Q$ and a raised cosine filter having 0.26 as a coefficient is used for a baseband filter.

Referring to FIG. 4, the graph shows the first and the second compensation signals DA and DB generated based on the digital I-channel signal DI and the digital Q-channel signal DQ.

Figure 5:
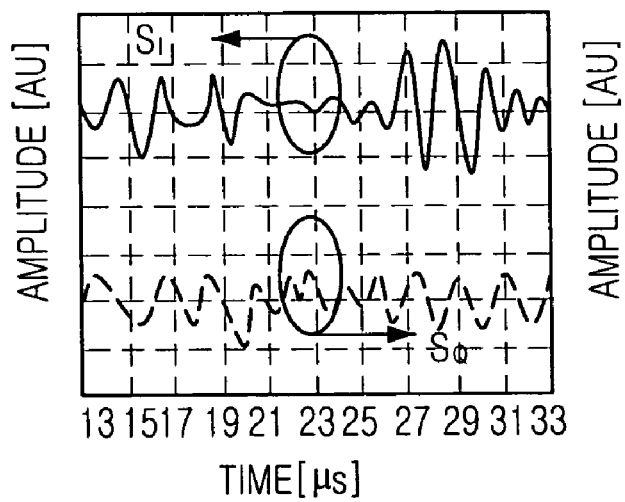
FIG. 5 is a graph showing waveforms of an I-channel baseband signal and a Q-channel baseband signal in a case that an amplitude imbalance between the I-channel signal and the Q-channel signal is 0.4 dB in accordance with a preferred embodiment of the present invention.

FIG. 5 is a graph showing waveforms of an I-channel baseband signal and a Q-channel baseband signal in a case that an amplitude imbalance between the I-channel signal and the Q-channel signal is 0.4 dB in accordance with a preferred embodiment of the present invention.

The waveforms of FIG. 5 are obtained from same simulation case of FIG. 4.

The graph of FIG. 5 shows an I-channel baseband signal $S_I$ and a Q-channel baseband signal $S_Q$ obtained from a RF transmitting signal from a weaver type frequency mixer having 0.4 dB amplitude imbalance.

As expected in Eqs. 3 and 4, a phase of the I-channel baseband signal $S_I$ and a phase of the Q-channel baseband signal $S_Q$ are reversed from a phase of the first compensation signal $D_A$ and a phase of the second compensation signal $D_B$, respectively in FIGS. 4 and 5.

Therefore, if a sign of the amplitude imbalance is positive (+), a spurious signal can be eliminated by continuously controlling a correlation value between the I-channel baseband signal $S_I$ or the Q-channel baseband signal $S_Q$ and the first compensation signal $D_A$ or the second compensation signal $D_B$ until the correlation value becomes to "0".

Figure 6:
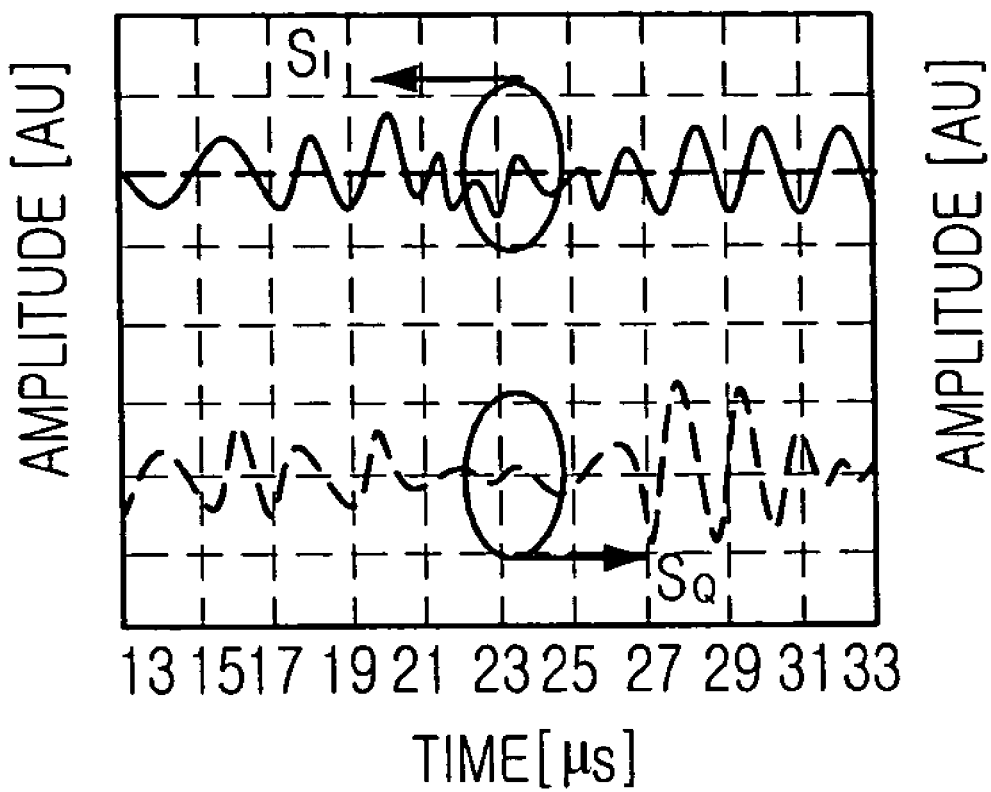
FIG. 6 is a graph showing waveforms of an I-channel baseband signal and a Q-channel baseband signal in a case that a phase imbalance between an I-channel signal and a Q-channel signal is −20 dB in accordance with a preferred embodiment of the present invention.

FIG. 6 is a graph showing waveforms of an I-channel baseband signal and a Q-channel baseband signal in a case that a phase imbalance between an I-channel signal and a Q-channel signal is −20 dB in accordance with a preferred embodiment of the present invention.

The waveforms of FIG. 6 are obtained from same simulation of FIG. 4.

The graph of FIG. 6 shows an I-channel baseband signal $S_I$ and a Q-channel baseband signal $S_Q$ obtained from a RF transmitting signal having 2° degrees of phase imbalance.

A phase of the I-channel baseband signal $S_I$ and a phase of the second compensation signal $D_B$ are reversed and a phase of the Q channel baseband signal $S_Q$ and a phase of the first compensation signal $D_A$ are reversed. Therefore, a sign of the phase imbalance is a positive (+), the spurious can be eliminated by continuously controlling a correlation value between the I-channel baseband signal $S_I$ or the Q-channel baseband signal $S_Q$ and the first compensation signal $D_A$ or the second compensation signal $D_B$ until the correlation value becomes to "0".

In the embodiment of the present invention, the signs of the amplitude imbalance and the phase imbalance are decided by a correlation value between the first compensation signal $D_A$ and the second compensation signal $D_B$ with the I-channel baseband signal $S_I$ and the Q-channel baseband signal $S_Q$. As shown in Eqs. 3 and 4, the signs of the amplitude imbalance and the phase imbalance can independently obtained by using one of Eqs. 3 and 4.

For obtaining the correlation value between the first compensation signal $D_A$ and the second compensation signal $D_B$ with the I-channel baseband signal $S_I$ and the Q-channel baseband signal $S_Q$, a time delay between the first compensation signal $D_A$ and the second compensation signal $D_B$ must be obtained. The time delay can be obtained by obtaining correlation coefficients by delaying the first compensation signal $D_A$ and the second compensation signal $D_B$ and selecting a time of maximum value of the correlation coefficient among the obtained correlation coefficients.

In the preferred embodiment of the present invention, there is a time delay of 9 μsec generated from a filter used in the simulation.

Figure 7:
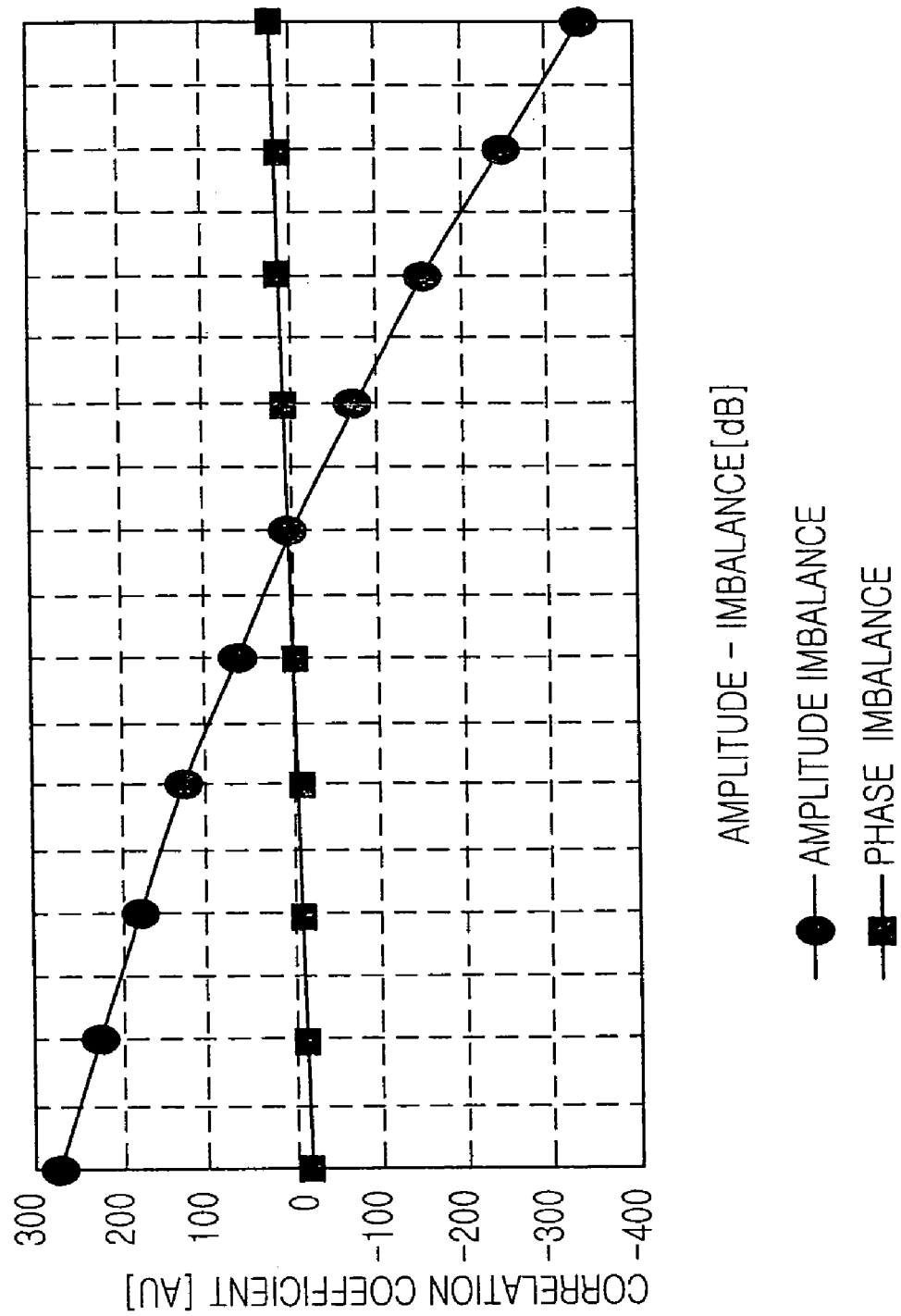
FIG. 7 is a graph showing correlation coefficients for compensating an amplitude imbalance in accordance with a preferred embodiment of the present invention.

FIG. 7 is a graph showing correlation coefficients for compensating an amplitude imbalance in accordance with a preferred embodiment of the present invention.

The graph shows correlation coefficients between the first compensation signal $D_A$ and the second compensation signal $D_B$ with the I-channel baseband signal $S_I$ according to the amplitude imbalance.

In a case of no amplitude imbalance, the correlation coefficient is 0. If an amplitude of a Q-channel signal in a weaver type frequency mixer becomes larger, the correlation coefficient becomes negative (−). If the amplitude of the Q-channel signal in the weaver type frequency mixer becomes small, the correlation coefficient becomes positive (+). Therefore, it can select one of I-channel signal and Q-channel signal having lager amplitude by using the sign of the correlation coefficient.

Referring to FIG. 7, since the graph is gained from a simulation with no amplitude imbalance, the correlation coefficient must be 0. However, there is small correlation coefficient is shown in FIG. 7.

Figure 8:
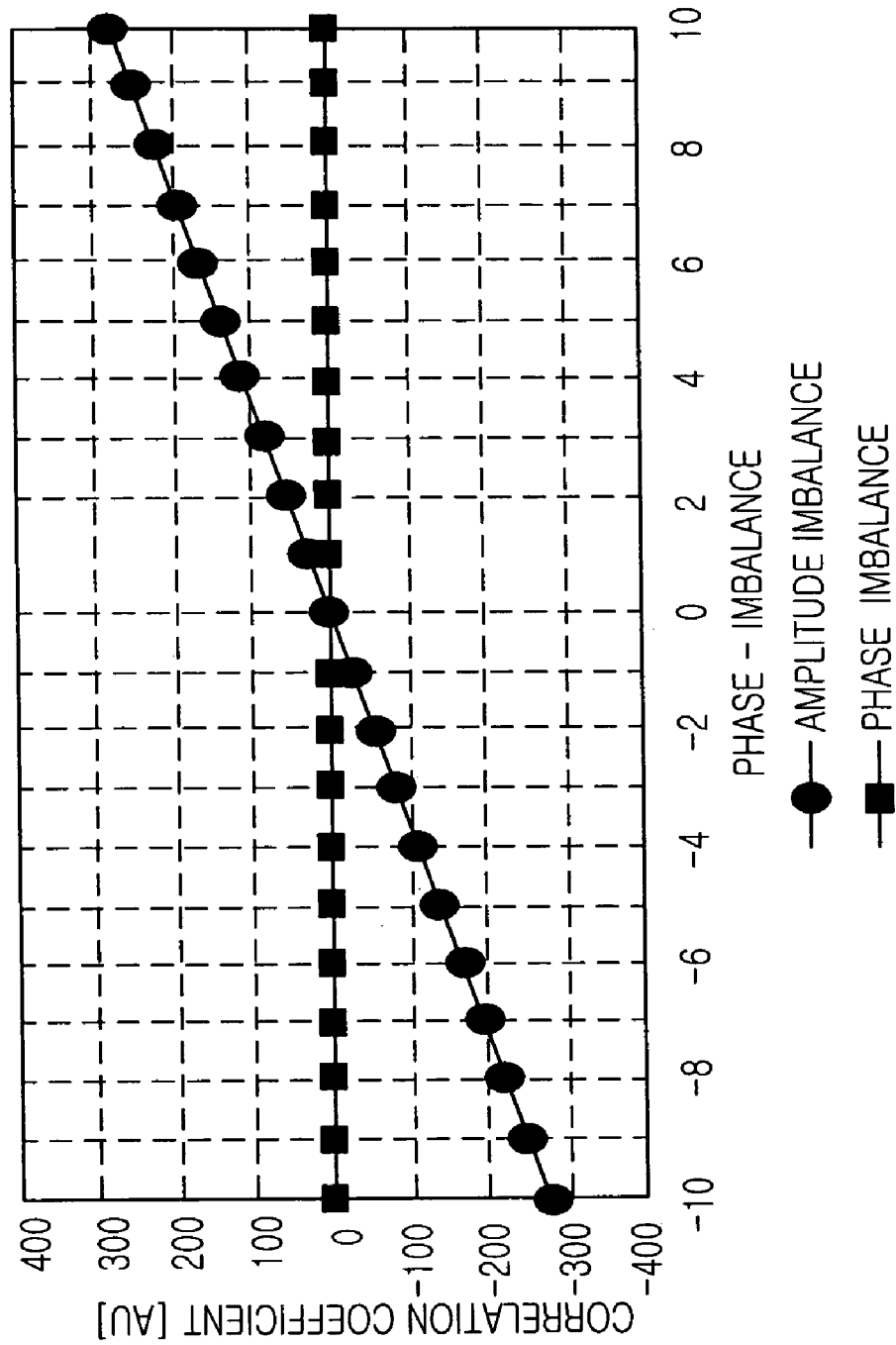
FIG. 8 is a graph showing correlation coefficients for compensating a phase imbalance in accordance with a preferred embodiment of the present invention.

FIG. 8 is a graph showing correlation coefficients for compensating a phase imbalance in accordance with a preferred embodiment of the present invention.

The graph shows correlation coefficients between the first compensation signal $D_A$ and the second compensation signal $D_B$ with the I-channel signal $S_I$ according to the phase imbalance.

In a case of no phase imbalance, the correlation coefficient is 0. If a phase of a Q-channel signal of the weaver type frequency mixer becomes faster, the correlation coefficient becomes positive (+). If the phase of the Q-channel signal of the weaver type frequency mixer becomes slower, the correlation coefficient becomes negative (−). Therefore, it can select one of I-channel signal and Q-channel signal having faster or slower phase by using the sign of the correlation coefficient.

Referring to FIG. 8, the phase imbalance can be compensated after the amplitude imbalance is compensated since the correlation coefficient is always 0 regardless to the phase, although there is the correlation coefficient shown when there is no phase imbalance.

Figure 9:
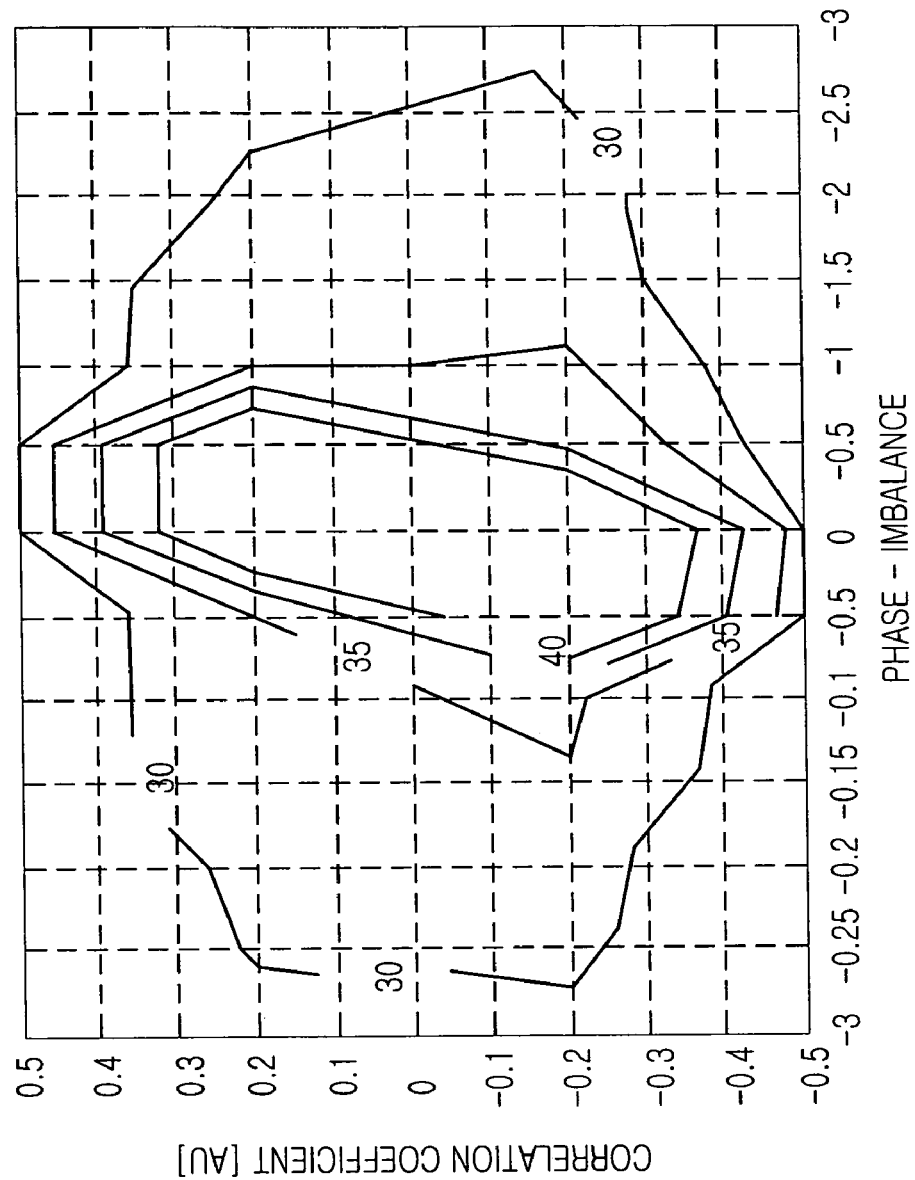
FIG. 9 is a graph showing a rate of suppressing a spurious of a radio frequency (RF) transmitting signal based on a phase imbalance and an amplitude imbalance.

FIG. 9 is a graph showing a rate of suppressing a spurious of a radio frequency (RF) transmitting signal based on a phase imbalance and an amplitude imbalance.

In a mobile communication system, the amplitude imbalance must maintain in a range of ±0.4 dB and the phase imbalance must maintain in a range of ±0.8 dB for satisfying the rate of suppressing the spurious of 40 dB.

As shown, the rate of suppressing of the present invention is 40 dB. Therefore, the present invention can satisfy the rate of suppressing the spurious required for the mobile communication system.

The above mentioned present invention can be implemented to various digital communication systems including a direct conversion digital quadrature transceiving system which requires suppressing the spurious signal.

The above mentioned present invention can be implemented as a set of computer-executable instructions and the set of computer-executable instructions can be stored in a computer-readable recording medium such as a CD-ROM, a RAN, a ROM, a floppy disk, a hard disk and an optical magnetic disk.

As mentioned above, the present invention can suppress a spurious signal of a radio frequency (RF) transmitting signal by detecting an amplitude imbalance and a phase imbalance between an I-channel signal and a Q-channel signal in a real time by directly using the RF transmitting signal.

Also, the present invention can suppress a spurious signal without requiring addition time for detecting an amplitude imbalance and a phase imbalance by directly using the RF transmitting signal.

Moreover, the present invention can adaptively suppress a spurious signal of a RF transmitting signal by directly using the RF transmitting signal since the RF transmitting signal is generated based on newly detected imbalances which may varied according to an environment condition such as a temperature.

Furthermore, the present invention can be implemented with a simple structure since the present invention does not require additional local oscillator.

The present application contains subject matter related to Korean patent application No. KR 2003-0088763, filed in the Korean patent office on Dec. 8, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An apparatus for detecting imbalances between an I-channel signal and a Q-channel signal in order to suppress a spurious signal in a direct conversion digital quadrature transmission system having a digital signal processor and a weaver type frequency mixer, the apparatus comprising:

means for generating a first compensation signal and a second compensation signal based on a digital I-channel signal and a digital Q-channel signal generated from the digital signal processor;

means for generating an I-channel baseband signal and a Q-channel baseband signal by converting a radio frequency transmitting signal outputted from the direct conversion digital quadrature transmission system into a low frequency signal by squaring the radio frequency transmitting signal and multiplexing the low frequency signal with two sine waves having difference phases; and means for detecting a phase imbalance and an amplitude imbalance between the digital I-channel signal and the digital Q-channel signal by using a correlation between the first compensation signal and the second compensation signal with the I-channel baseband signal and the Q-channel baseband signal.

2. The apparatus of claim 1, wherein the first compensation signal is generated by squaring the digital I-channel signal and the digital Q-channel signal and calculating a difference between the squared digital I-channel signal and the squared digital Q-channel signal and the second compensation signal is generated by multiplexing the digital I-channel signal and the digital Q-channel signal.

3. The apparatus of claim 1, wherein the detecting mean detects the amplitude imbalance and the phase imbalance by obtaining the correlation between the I-channel baseband signal and the first compensation baseband signal and the second compensation baseband signal based on an equation as:

$$S_I = -\frac{1}{2}D_B(1+\Delta A)\sin(\Delta\theta) - \frac{1}{8}D_A\Delta A(1+\Delta A),$$

wherein $S_I$ is the I-channel baseband signal, $D_B$ is the second compensation signal, $D_A$ is the first compensation signal, $\Delta A$ is the amplitude imbalance and $\Delta\theta$ is the phase imbalance.

4. The apparatus of claim 1, wherein the detecting means detects the amplitude imbalance and the phase imbalance by obtaining the correlation between the Q-channel baseband signal and the first compensation baseband signal and the second compensation baseband signal based on an equation as:

$$S_Q = \frac{1}{4}D_A(1+\Delta A)\sin(\Delta\theta) - \frac{1}{4}D_B\Delta A(1+\Delta A),$$

wherein $S_I$ is the I-channel baseband signal, $D_B$ is the second compensation signal, $D_A$ is the first compensation signal, $\Delta A$ is the amplitude imbalance and $\Delta\theta$ is the phase imbalance.

5. A direct conversion digital quadrature transmission system, comprising:
   means for generating a digital I-channel signal and a digital Q-channel signal;
   means for generating a radio frequency signal by converting the digital I-channel signal and the digital Q-channel signal into the radio frequency signal;
   means for generating a first compensation signal and a second compensation signal by mixing the digital I-channel signal and the digital Q-channel signal;
   means for generating an I-channel baseband signal and a Q-channel baseband signal by converting the radio frequency signal into a low intermediate frequency (IF) signal by squaring the radio frequency signal and multiplexing the low IF signal with two sine waves having different phases; and
   means for detecting a phase imbalance and an amplitude imbalance by a correlation between the first compensation signal and the second compensation signal, and the I-channel baseband signal and the Q-channel baseband signal,
   wherein the digital I-channel signal and the digital Q-channel signal generating means generates the digital I-channel signal and the digital Q-channel signal in response to detected phase imbalance and the amplitude imbalance.

6. The apparatus of claim 5, wherein the first compensation signal is generated by squaring the digital I-channel signal and the digital Q-channel signal and calculating a difference between the squared digital I-channel signal and the squared digital Q-channel signal and the second compensation signal is generated by multiplexing the digital I-channel signal and the digital Q-channel signal.

7. The apparatus of claim 5, wherein the detecting mean detects the amplitude imbalance and the phase imbalance by obtaining the correlation between the I-channel baseband signal and the first compensation baseband signal and the second compensation baseband signal based on an equation as:

$$S_I = -\frac{1}{2}D_B(1+\Delta A)\sin(\Delta\theta) - \frac{1}{8}D_A\Delta A(1+\Delta A),$$

wherein $S_I$ is the I-channel baseband signal, $D_B$ is the second compensation signal, $D_A$ is the first compensation signal, $\Delta A$ is the amplitude imbalance and $\Delta\theta$ is the phase imbalance.

8. The apparatus of claim 5, wherein the detecting means detects the amplitude imbalance and the phase imbalance by obtaining the correlation between the Q-channel baseband signal and the first compensation baseband signal and the second compensation baseband signal based on an equation as:

$$S_Q = \frac{1}{4}D_A(1+\Delta A)\sin(\Delta\theta) - \frac{1}{4}D_B\Delta A(1+\Delta A),$$

wherein $S_I$ is the I-channel baseband signal, $D_B$ is the second compensation signal, $D_A$ is the first compensation signal, $\Delta A$ is the amplitude imbalance and $\Delta\theta$ is the phase imbalance.

9. A method for detecting imbalances between an I-channel signal and a Q-channel signal in order to suppress a spurious signal in a direct conversion digital quadrature transmission system having a digital signal processor and a weaver type frequency mixer, the method comprising the steps of:
   a) generating a digital I-channel signal and a digital Q-channel signal by converting a transmitting data into the digital I-channel signal and the digital Q-channel signal;
   b) generating a radio frequency signal by converting the digital I-channel signal and the digital Q-channel signal into the radio frequency signal;
   c) generating a first compensation signal and a second compensation signal by using the digital I-channel signal and the digital Q-channel signal;
   d) generating an I-channel baseband signal and a Q-channel baseband signal by converting the radio frequency signal into a low intermediate frequency signal by squaring the radio frequency signal and multiplexing the low frequency signal with two sine waves having difference phases;
   e) detecting a phase imbalance and an amplitude imbalance by using a correlation between the first compensation signal and the second compensation signal with the I-channel baseband signal and the Q-channel baseband signal; and
   f) compensating the digital I-channel signal and the digital Q-channel signal in response to the detected phase imbalance and the detected amplitude imbalance.

10. The method of claim 9, wherein in the step c), the first compensation signal is generated by squaring the digital I-channel signal and the digital Q-channel signal and calculating a difference between the squared digital I-channel signal and the squared digital Q-channel signal and the second compensation signal is generated by multiplexing the digital I-channel signal and the digital Q-channel signal.

11. The method of claim 9, wherein in the step e), the amplitude imbalance and the phase imbalance are detected by obtaining the correlation between the I-channel baseband signal and the first compensation baseband signal and the second compensation baseband signal based on an equation as:

$$S_I = -\frac{1}{2}D_B(1+\Delta A)\sin(\Delta\theta) - \frac{1}{8}D_A\Delta A(1+\Delta A),$$

wherein $S_I$ is the I-channel baseband signal, $D_B$ is the second compensation signal, $D_A$ is the first compensation signal, $\Delta A$ is the amplitude imbalance and $\Delta\theta$ is the phase imbalance.

12. The method of claim 9, wherein in the step e), the amplitude imbalance and the phase imbalance are detected by obtaining the correlation between the Q-channel baseband signal and the first compensation baseband signal and the second compensation baseband signal based on an equation as:

$$S_Q = \frac{1}{4}D_A(1+\Delta A)\sin(\Delta\theta) - \frac{1}{4}D_B\Delta A(1+\Delta A),$$

wherein $S_I$ is the I-channel baseband signal, $D_B$ is the second compensation signal, $D_A$ is the first compensation signal, $\Delta A$ is the amplitude imbalance and $\Delta\theta$ is the phase imbalance.

* * * * *